United States Patent

Morita et al.

[11] Patent Number: 5,853,483
[45] Date of Patent: Dec. 29, 1998

[54] SUBSTRATE SPIN TREATING METHOD AND APPARATUS

[75] Inventors: Akihiko Morita; Kenji Ueno, both of Kyoto, Japan

[73] Assignee: Dainippon Screen Mfg. Co., Ltd., Kyoto, Japan

[21] Appl. No.: 644,376

[22] Filed: May 10, 1996

[30] Foreign Application Priority Data

May 5, 1995 [JP] Japan .................................. 7-141270
May 2, 1995 [JP] Japan .................................. 7-236070

[51] Int. Cl.⁶ .............................. B05C 11/00; B08B 3/00
[52] U.S. Cl. ............................ 118/712; 118/52; 118/319; 134/902; 134/153; 134/157; 396/611; 396/627
[58] Field of Search .................................. 134/902, 157, 134/158, 140, 149, 153; 118/52, 320, 668, 712, 319; 396/611, 627; 156/345

[56] References Cited

U.S. PATENT DOCUMENTS 5,032,217  7/1991  Tanaka ................................. 134/902
5,421,056  6/1995  Tateyama et al. ..................... 134/902

FOREIGN PATENT DOCUMENTS 286144  9/1988  Japan .
629131  9/1992  Japan .

*Primary Examiner*—James Engel
*Assistant Examiner*—Calvin Padgett
*Attorney, Agent, or Firm*—Ostrolenk, Faber, Gerb & Soffen, LLP

[57] ABSTRACT

A substrate supporting device includes support elements for supporting a substrate, and positioning elements for contacting outer peripheries of the substrate to check horizontal movement thereof. A substrate sensor is disposed around the supporting device for detecting the substrate supported thereon. The supporting device is surrounded also by light projectors for horizontally projecting light having projection tracks overlapping, in a plan view, the substrate supported by the substrate supported device and extending at an angle to one another, and light receivers for receiving the projected light. The substrate sensor and light receivers input signals to a microcomputer for determining whether the substrate is correctly supported. A light projector may project a light beam toward the surface of the substrate supporting on the substrate supporting device, and cause the light beam to be reflected by the substrate surface. Whether the substrate is correctly supported may be determined based on whether the reflected light beam is received by a light receiver. The determination of the substrate being correctly supported is made while the substrate is supported on the supporting device. When the substrate is correctly supported, the substrate supporting device is rotated about a vertical axis to effect a predetermined treatment of the substrate.

18 Claims, 5 Drawing Sheets

|  | light receiver22 | light receiver32 | decision |
|---|---|---|---|
| Case 1 | ON | OFF | facet up |
| Case 2 | OFF | ON | facet down |
| Case 3 | OFF | OFF | error |

SUBSTRATE SPIN TREATING METHOD AND APPARATUS

BACKGROUND OF THE INVENTION (1). Field of the Invention

The present invention relates to substrate spin treating methods for treating semiconductor wafers, glass substrates for liquid crystal displays, glass substrates for photomasks, substrates for optical disks and the like. More particularly, the invention relates to a substrate spin treating method in which a substrate is placed on a substrate supporting device including support elements and positioning elements, and the substrate supporting device is rotated about a vertical axis after confirming that the substrate is maintained in a correct posture. A cleaning liquid such as deionized water may be supplied to the spinning substrate to clean the substrate, a coating solution such as photoresist may be supplied to the spinning substrate to form a layer thereon, or a developing solution may be supplied to the spinning substrate to develop an image thereon. The invention also relates to a substrate spin treating apparatus suited for executing the above method.

(2). Description of the Related Art

In a substrate spin treating apparatus such as a spin coater, spin developer or spin scrubber, a spinning substrate could fall off the substrate supporting device and be damaged. This happens when the substrate is placed in an incorrect posture on the substrate supporting device, e.g. inclined or mounted on the positioning elements.

It is therefore necessary to determine, immediately after placing the substrate on the substrate supporting device and prior to spinning the substrate for treatment, whether the substrate is maintained in a correct posture or not.

Japanese Patent Publication (Unexamined) No. 2-86144 and Japanese Utility Model Publication (Unexamined) No. 6-29131, for example, disclose a conventional technique of determining whether a substrate is maintained in a correct posture.

According to the conventional technique, a light projector for projecting a light beam is vertically opposed, across a substrate, to a light receiver for receiving the light beam and outputting a light reception signal. The light projector and light receiver are arranged such that the optical axis extending therebetween is constantly blocked by the substrate during one rotation if the substrate is supported in a correct posture by a substrate supporting device. The substrate is rotated at low speed, and whether the substrate is placed in the correct posture on the substrate supporting device is determined from the light reception signal outputted during one rotation.

That is, the substrate placed in the correct posture intercepts the light beam all through the period of one rotation, and hence no reception signal is outputted. Conversely, when the substrate is placed in an incorrect posture, the light receiver receives the light beam from the light projector in at least one position in the course of one rotation of the substrate, whereby the light receiver outputs a reception signal. In this way, whether the substrate is in the correct posture is determined from the presence or absence of the light reception signal.

According to the conventional technique, however, a substrate must be rotated at a low speed once after being placed on the substrate supporting device in order to determine whether the substrate is maintained in the correct posture. In this way, the posture of the substrate is determined by a time-consuming process.

SUMMARY OF THE INVENTION

The present invention has been made having regard to the state of the art noted above, and its object is to provide a substrate spin treating method and apparatus for instantaneously determining whether the substrate is maintained in a correct posture or not after placing the substrate on a substrate supporting device.

The above object is fulfilled, in a first aspect of the present invention, by a substrate spin treating method for effecting a predetermined treatment of a substrate by placing the substrate on a substrate supporting device and spinning the substrate about a vertical axis, the method comprising:

a posture determining step for projecting light having a plurality of horizontal projection tracks overlapping, in plan view, the substrate supported by the substrate supporting device and extending at an angle to one another from positions around the substrate supporting device, with the substrate supported still on the substrate supporting device including support elements for supporting the substrate and positioning elements for contacting outer peripheries of the substrate to check a horizontal movement thereof, and determining whether the substrate is correctly supported by the substrate supporting device, based on signals from light receivers for receiving the light in positions around the substrate supporting device and a signal from a substrate sensor for detecting presence of the substrate supported by the substrate supporting device; and a substrate treating step executed, when the substrate is correctly supported by the substrate supporting device, for rotating the substrate supporting device about the vertical axis to effect the predetermined treatment of the substrate.

According to the method in the first aspect of the invention, the substrate treating step is preceded by the posture determining step at which presence of a substrate is detected by the substrate sensor after the substrate is introduced and placed on the substrate supporting device. In parallel with the detection of the substrate, a state of light reception by the light receiving device is checked. When part of the projected light is intercepted by the substrate, resulting in a quantity of light reception below a predetermined quantity, the condition is determined to be defective with the substrate being inclined or mounted on the positioning elements. If the light is not intercepted by the substrate, the substrate may be determined to be correctly supported. Thus, according to the method in the first aspect of the invention, whether the substrate is supported correctly or not is determined instantaneously without rotating the substrate, thereby reducing treatment time.

The substrate spin treating method in the first aspect of the invention may be executed with a substrate spin treating apparatus comprising:

a substrate supporting device including support elements for supporting the substrate, and positioning elements for contacting outer peripheries of the substrate to check a horizontal movement thereof;

a rotating device for rotating the substrate supporting device about the vertical axis;

a substrate sensor for detecting the substrate supported by the substrate supporting device;

a light projecting device disposed around the substrate supporting device for projecting light having a plurality of horizontal projection tracks overlapping, in plan view, the substrate supported by the substrate supporting device and extending at an angle to one another;

a light receiving device disposed around the substrate supporting device to pair with the light projecting device;

a posture determining device for determining whether the substrate is correctly supported by the substrate supporting device, based on signals from the substrate sensor and the light receiving device; and a substrate treating device for effecting the predetermined treatment of the substrate supported by the substrate supporting device.

Where the light projecting device and the light receiving device include plural pairs of light projectors and light receivers, the posture of the substrate may be determined with increased reliability.

The light projecting device and the light receiving device may include a single pair of light projector and light receiver, and a reflector for reflecting the light from the light projector to the light receiver. The posture of the substrate may be determined with this simplified construction also.

The substrate spin treating method in the first aspect of the invention may further comprise a warning step for giving an alarm when the substrate is determined at the posture determining step to be incorrectly supported by the substrate supporting device. Then, the operator can be notified of the incorrectly supported condition of the substrate to avoid treatment being carried out for a substrate not correctly supported by the substrate supporting device.

In a second aspect of the invention, there is provided a substrate spin treating method for effecting a predetermined treatment of a substrate by placing the substrate on a substrate supporting device and spinning the substrate about a vertical axis, the method comprising:

a posture determining step for projecting a light beam toward the substrate supported on the substrate supporting device including support elements for supporting the substrate and positioning elements for contacting outer peripheries of the substrate to check a horizontal movement thereof, and determining whether the substrate is correctly supported by the substrate supporting device, based on whether the light beam reflected by a surface of the substrate is received by a light receiver; and a substrate treating step executed, when the substrate is correctly supported by the substrate supporting device, for rotating the substrate supporting device about the vertical axis to effect the predetermined treatment of the substrate.

According to this second method, the substrate treating step is preceded by the posture determining step at which the light beam reflected by the surface of the substrate is detected by the light receiving device when the substrate is correctly supported, but is not detected when the substrate is incorrectly supported. In this way, the posture of the supported substrate may be determined by checking the light reception by the light receiving device. Thus, the like the first method second method also determines whether the substrate is correctly supported or not without rotating the substrate, thereby reducing treatment time.

The substrate spin treating method in the second aspect of the invention may be executed with a substrate spin treating apparatus comprising:

a substrate supporting device including support elements for supporting the substrate, and positioning elements for contacting outer peripheries of the substrate to check a horizontal movement thereof;

a rotating device for rotating the substrate supporting device about the vertical axis;

a light projecting device for projecting a light beam toward the substrate supported on the substrate supporting device, and causing the light beam to be reflected by a surface of the substrate;

a light receiving device for receiving the light beam reflected;

a posture determining device for determining whether the substrate is correctly supported by the substrate supporting device, based on whether the light beam reflected is received by the light receiving device; and a substrate treating device for effecting the predetermined treatment of the substrate supported by the substrate supporting device.

The substrate spin treating method in the second aspect of the invention may further comprise a warning step for giving an alarm when the substrate is determined at the posture determining step to be incorrectly supported by the substrate supporting device. Then, the incorrectly supported condition of the substrate may be notified to the operator to avoid treatment from being carried out for a substrate not correctly supported by the substrate supporting device.

In the substrate spin treating method in the second aspect of the invention, the posture determining step may be executed for projecting first and second light beams toward upper and lower surfaces of the substrate supported on the substrate supporting device, and determining whether the substrate is correctly supported by the substrate supporting device, based on whether the light beams reflected by the upper and lower surfaces of the substrate are received by first and second light receivers, respectively. With this method, which surface of the substrate is the facet may be determined while determining whether the substrate is supported at a correct posture or not.

This feature of the method may be realized by the substrate spin treating apparatus in the second aspect of the invention wherein the light projecting device includes first and second light projectors for projecting first and second light beams toward upper and lower surfaces of the substrate supported on the substrate supporting device, and causing the first and second light beams to be reflected by the surfaces of the substrate, respectively, and the light receiving device includes first and second light receivers for receiving the first and second light beams reflected, respectively, the posture determining device determining whether the substrate is correctly supported by the substrate supporting device, based on light reception by the first and second light receivers.

In the substrate spin treating method in the second aspect of the invention, the posture determining step may be executed, with a substrate of a selected size supported still at a height corresponding to the selected size on the substrate supporting device adapted for selectively supporting a plurality of N (N being an integer 2 or more) substrates of different sizes at varied heights, for projecting a plurality of N light beams toward the substrate of the selected size, causing the light beams to be reflected by a surface of the substrate, and determining whether the substrate is correctly supported by the substrate supporting device, based on whether the plurality of N reflected light beams are received by the light receivers. With this method, the size of the supported substrate may be identified while determining whether the substrate is supported in a correct posture or not.

This feature of the method may be realized by the substrate spin treating apparatus in the second aspect of the invention wherein the substrate supporting device is constructed for a plurality of N (N being an integer 2 or more) supporting substrates of different sizes at varied heights, the light projecting device including a plurality of N light projectors arranged in corresponding relations with the varied heights, the light receiving device including a plurality of N light receivers arranged in corresponding relations with the varied heights, the posture determining device determining whether a substrate of a selected size is correctly supported at one of the varied heights corresponding to the selected size by the substrate supporting device, based on light reception by the light receivers of the plurality of N light beams emitted from the light projectors toward the substrate of the selected size and reflected by a surfaces of the substrate supported on the substrate supporting device.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DETAILED DESCRIPTION OF THE PREFERRED EMBODIMENTS

Preferred embodiments of the present invention will be described in detail hereinafter with reference to the drawings.

First Embodiment

The first embodiment corresponds to the substrate spin treating method and apparatus in the first aspect of the invention.

Figure 1:
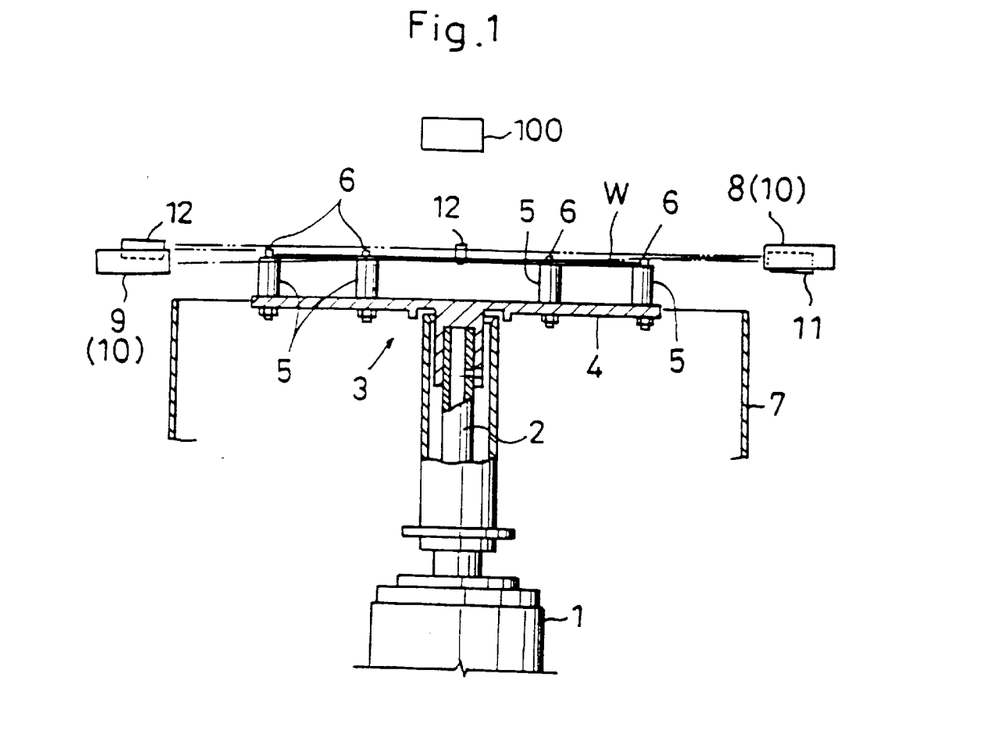
FIG. 1 is a schematic side view of a substrate spin treating apparatus in a first embodiment of the present invention.
Figure 2:
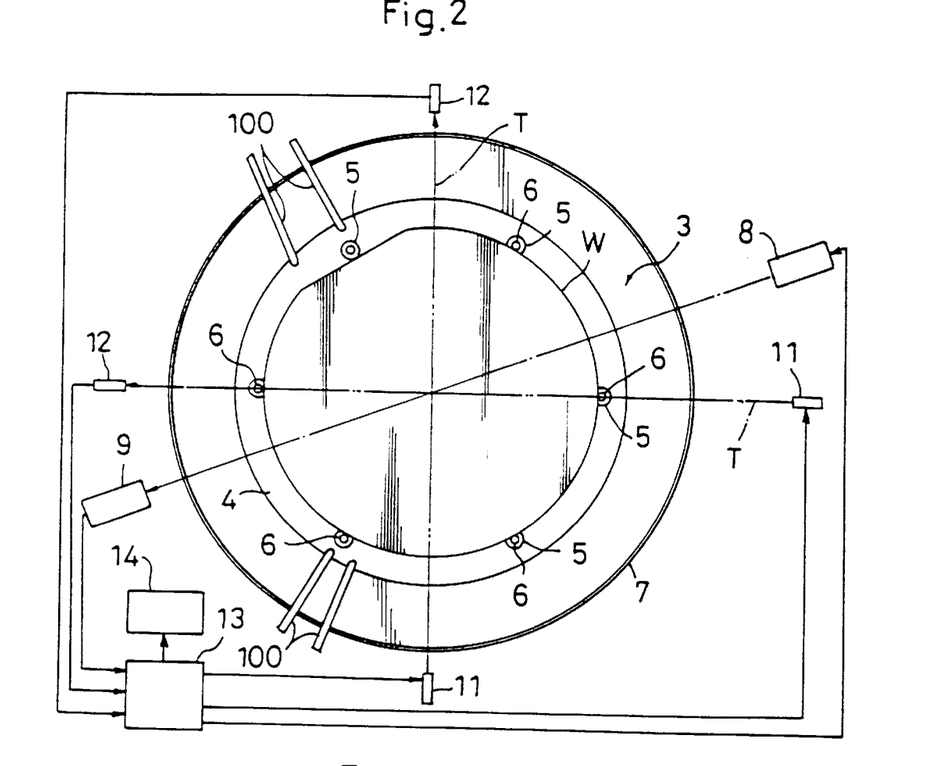
FIG. 2 is a schematic plan view of the apparatus in the first embodiment.

As shown in FIGS. 1 and 2, the apparatus includes an electric motor 1 acting as a rotating device and having a drive shaft 2, and a substrate supporting device 3 attached to an upper end of the drive shaft 2 to be rotatable together about a vertical axis.

Figure 3A:
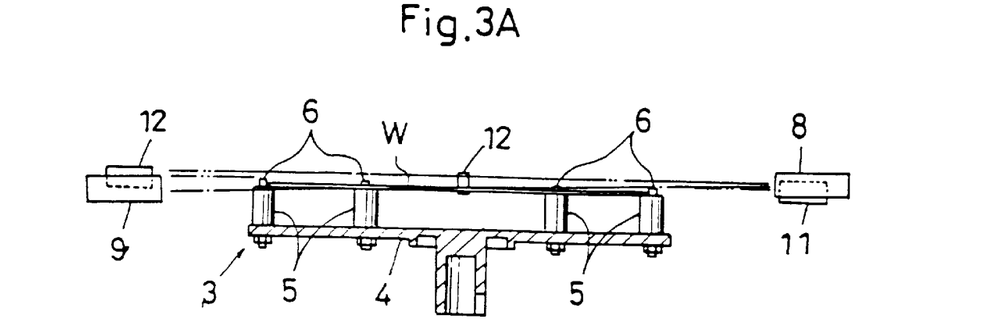
FIGS. 3A and 3B are side views of a principal portion of the apparatus showing substrate supporting conditions.
Figure 3B:
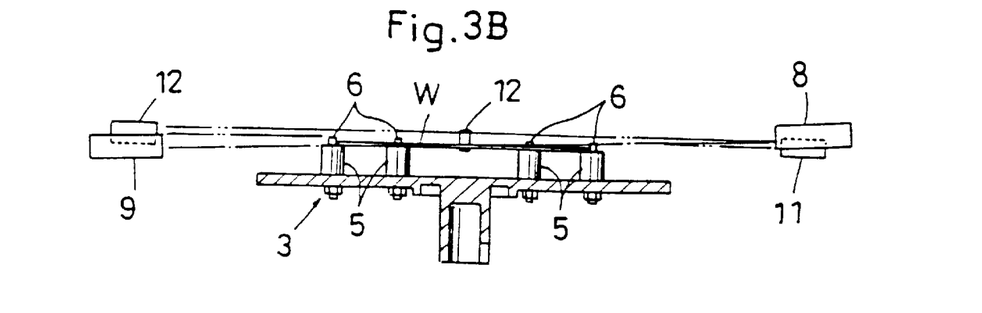

The substrate supporting device 3 includes a turntable 4, and substrate support elements 5 arranged at intervals circumferentially of the turntable 4 for supporting a substrate or wafer W at lower peripheral positions thereof. Each support element 5 has a positioning element 6 projecting from an upper end thereof for contacting an outer periphery of wafer W to check a horizontal movement thereof. Though not shown in the drawings, the turntable 4 defines mounting bores spaced from one another radially thereof to enable rearrangement of the support elements 5. As shown in FIGS. 3A and 3B, the support elements 5 may receive a large wafer W (FIG. 3A) and a small wafer W (FIG. 3B). The support elements 5 and positioning elements 6 may be attached separately and individually to the turntable 4.

The substrate supporting device 3 is surrounded by a vertically movable cup 7. When various types of treatment, such as a cleaning treatment with deionized water, are carried out, the cup 7 is raised to enclose the substrate supporting device 3 therein to prevent treating liquids from scattering by a centrifugal force.

A light projector 8 is disposed horizontally outside the cup 7 and above upper ends of the positioning elements 6 for projecting light in a slightly downward direction. A light receiver 9 is disposed horizontally outside the cup 7, below the upper ends of the support elements 5, and opposite the light projector 8 across the substrate supporting device 3, for receiving the light from the light projector 8. The light projector 8 and light receiver 9 constitute a substrate sensor 10 for detecting wafer W supported by the substrate supporting device 3.

Further, light projectors 11 are arranged horizontally outside the cup 7 and above the upper ends of the support elements 5 for projecting light horizontally. These light projectors 11 are displaced from each other by an angle approximately corresponding to a ¼ rotation of wafer W. Light receivers 12 are opposed to the light projectors 11 across the substrate supporting device 3 for receiving the light from the light projectors 11, respectively. The light from the projectors 11 travels along projection tracks T overlapping the wafer W on the substrate supporting device 3 and crossing each other in plan view (i.e. not parallel). Each light projector 11 includes a plurality of light emitting elements arranged within a vertical range thereof for emitting a light beam having a vertical range exceeding the thickness of wafer W. Each light receiver 12 includes a plurality of light receiving elements in a similar arrangement.

The light projectors 8 and 11 and light receivers 9 and 12 are connected to a microcomputer 13 acting as a posture determining device. An alarm (warning device) 14 such as a buzzer or flasher is also connected to the microcomputer 13.

After the wafer W is transported into the apparatus, the microcomputer 13 causes the light projectors 8 and 11 to project light, receives the light reception signals from the light receivers 9 and 12, and determines from these signals whether the wafer W is correctly supported or not.

Figure 4A:
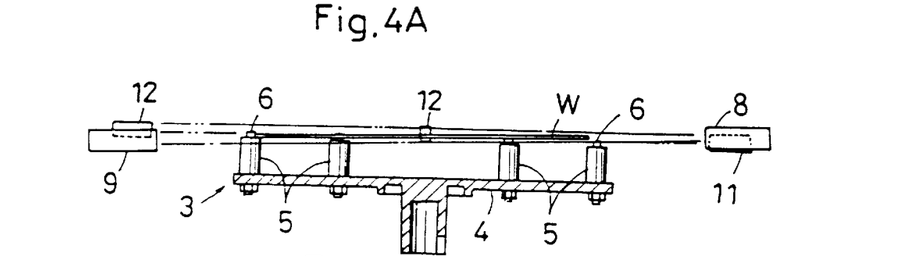
FIGS. 4A and 4B are side views of the principal portion showing substrate supporting conditions.
Figure 4B:
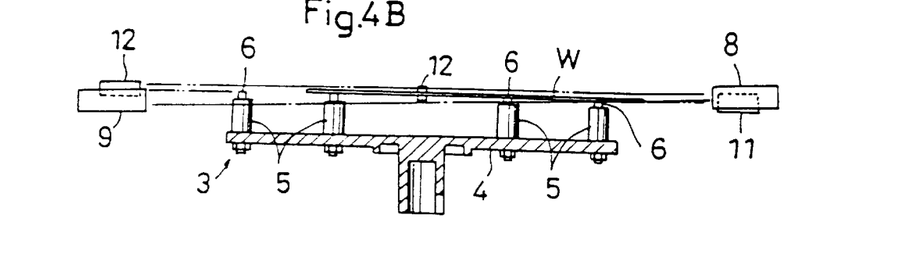

When, as shown in FIG. 4A, the wafer W is supported in an inclined state by the substrate supporting device 3 through the support elements 5, with part of the wafer W mounted on the positioning elements 6, at least one of the light receivers 12 receives a reduced quantity of light. When, as shown in FIG. 4B, the wafer W is mounted on the positioning elements 6 and supported at a higher level than the supporting position of the support elements 5, both of the light receivers 12 receive a reduced quantity of light. When, as shown in FIG. 3A or 3B, the wafer W is supported in a correct position by the support elements 5, both of the light receivers 12 receive a full quantity of light.

Thus, the presence of wafer W is detected based on a light intercept signal inputted from the light receiver 9 acting as part of the substrate sensor 10. The properly supported condition of wafer W is confirmed based on at least a predetermined quantity of light received by each posture determining light receiver 12 without being intercepted. When the wafer W is incorrectly supported, the microcomputer 13 outputs an alarm signal to the alarm 14 which notifies the operator of the incorrectly supported condition of the wafer W.

In the substrate spin treating method executed with this substrate spin treating apparatus, the posture of wafer W is confirmed after the wafer W is transported into the apparatus, When the wafer W is found incorrectly supported, an alarm is given to suspend the treatment. When the wafer W is correctly supported, the electric motor 1 is driven to rotate the substrate supporting device 3 about the vertical axis. The spinning wafer W is treated with a treating device 100 (e.g. cleaning, photoresist application or development).

Where the apparatus is a spin coater, the treating device 100 includes coating solution dispensing nozzles for delivering a coating solution such as a photoresist solution to the wafer W. In the case of a spin developer, the treating device 100 includes developer dispensing nozzles for delivering a developer to the wafer W. In the case of a spin scrubber, the treating device 100 may include cleaning liquid nozzles for delivering a cleaning liquid to the wafer W and a brush or the like for scrubbing the wafer W.

In the examples shown in FIG. 2, and in FIG. 5 which will be described hereinafter, the treating device 100 comprises cleaning liquid nozzles.

The substrate spin treating method will be described briefly hereunder, exemplifying a system for cleaning the wafer W.

The wafer W is taken out of a cassette, and supplied to a substrate reversing unit for reversing the wafer W. The reversed wafer W is transported into the substrate spin treating apparatus, and then a correctly supported condition of the wafer W is confirmed. If the wafer W is found incorrectly supported, an alarm is given to suspend the treatment. If the wafer W is correctly supported, the cup 7 is raised, the wafer W is spun, and the cleaning liquid is supplied for cleaning treatment. After the treatment, the cup 7 is lowered and the cleaned wafer W is supplied to the substrate reversing unit for reversing the wafer W back to the original posture. The wafer W is transported into the substrate spin treating apparatus again to receive a similar cleaning treatment. Finally, the wafer W with the opposite surfaces cleaned is returned to the cassette.

In the above treating process, whether the wafer W is supported in a correct posture or not is determined immediately after the wafer W is transported into the substrate spin treating apparatus and placed on the substrate supporting device 3, without rotating the wafer W (substrate supporting device 3). This feature realizes a reduced time required for treating the wafer W.

The following results have been obtained from comparative experiment. In the conventional method of determining whether wafer W is supported in a correct posture or not through one rotation of the wafer W, 7 seconds are required for an 8-inch wafer, and 4 seconds for a 6-inch wafer. According to the above embodiment, the posture is determined in one second irrespective of wafer sizes.

Second Embodiment

The second embodiment also corresponds to the substrate spin treating method and apparatus in the first aspect of the invention.

Figure 5:
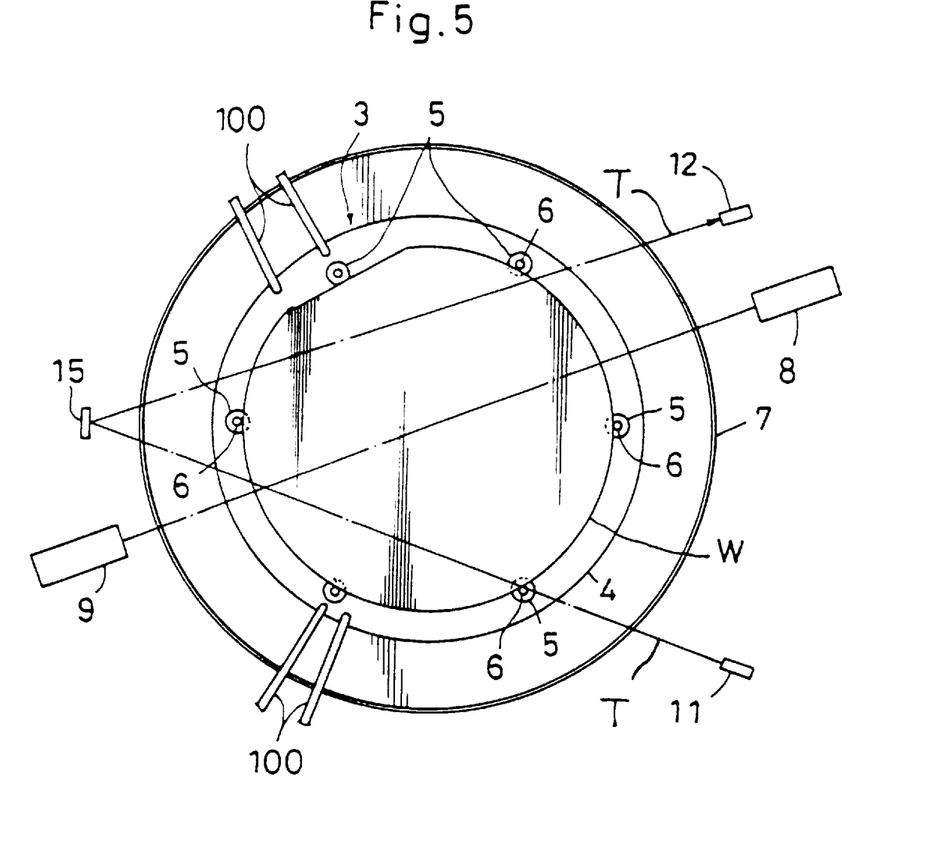
FIG. 5 is a schematic plan view of a substrate spin treating apparatus in a second embodiment of the invention.

As shown in FIG. 5, the apparatus includes one pair of light projector 11 and light receiver 12 along with a reflector 15 such as a mirror or facet member for use in determining wafer postures. The light projector 11 projects light to the reflector 15, and the light receiver 12 receives the light reflected by the reflector 15. The projection track T extending from the light projector 11 to the reflector 15 and the projection track T from the reflector 15 to the light receiver 12 are not parallel to each other in plan view. The second embodiment is the same as the first embodiment in the other respects. Parts identical to those of the first embodiment are shown with the same reference numerals, and are not described again.

According to the second embodiment, only one light projector and one light receiver serves the purpose with the addition of reflector 15. The apparatus is simplified and manufactured at low cost, with a reduced number of components and a reduced number of variables processed by the microcomputer 13.

In the first and second embodiments, the posture determining device may employ the following functions instead of using the microcomputer 13, for example. Each of the light receivers 9 and 12 is given a light reception state "1" and a light interception state "0". The signal from the light receiver 9 of the substrate sensor 10 is inputted to a NOT circuit to be inverted. The output of the NOT circuit and the signal from the light receiver 12 are inputted to an AND circuit. Whether the wafer W is supported in the correct posture or not is determined based on the output of the AND circuit, and the alarm 14 is driven as necessary.

Third Embodiment

The third embodiment corresponds to the substrate spin treating method and apparatus in the second aspect of the invention.

Parts identical to those of the first and second embodiments are shown with the same reference numerals as in FIGS. 1 through 5, and are not described again.

Figure 6:
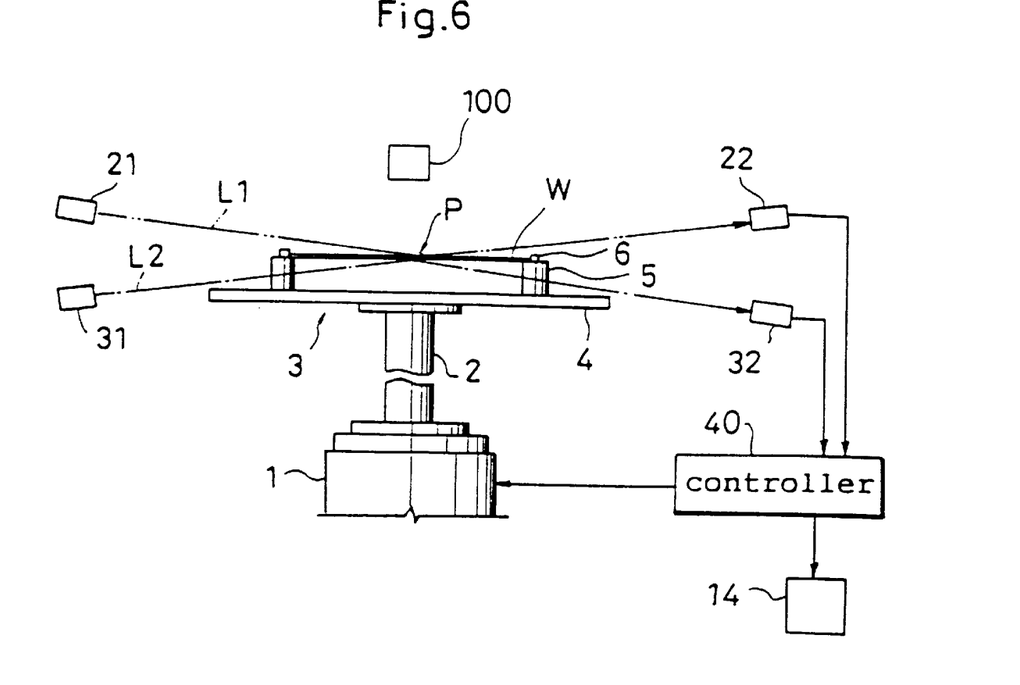
FIG. 6 is a schematic side view of a substrate spin treating apparatus in a third embodiment of the invention.
Figure 7:
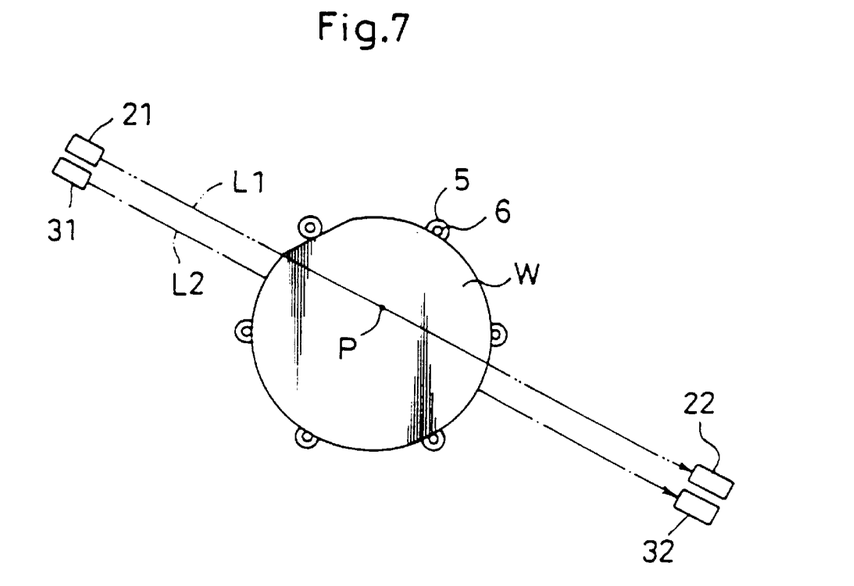
FIG. 7 is a schematic plan view of the apparatus in the third embodiment.

As shown in FIGS. 6 and 7, the apparatus includes a first reflection type optical sensor having a first light projector 21 and a first light receiver 22 arranged around the substrate supporting device 3 and above a horizontal plane including the wafer W. Similarly, a second reflection type optical sensor is provided, which has a second light projector 31 and a second light receiver 32 arranged around the substrate supporting device 3 but below the horizontal plane including the wafer W. Preferably, the first and second light projectors 21 and 31 project non-diffusible light beams, and use of laser emitters is particularly desirable.

The third embodiment includes a controller 40 for performing various controls. The controller 40 acts as a control device for controlling the electric motor 1 and light beam emission from the first and second light projectors 21 and 31. The controller 40 acts also as a posture determining device for determining from outputs (detection results) of the first and second light receivers 22 and 32 whether the wafer W is in the correct posture or not. The controller 40 comprises a microcomputer, for example.

The wafer (e.g. semiconductor wafer) W usually has one of the surfaces defining a facet. When the wafer W is supported in the correct posture by the substrate supporting device 3, with the facet facing up, the first light beam L1 emitted from the light projector 21 of the first reflection type optical sensor is reflected at point P on the upper surface of wafer W and received by the first light receiver 22. When the wafer W is supported in the correct posture by the substrate supporting device 3, with the facet facing down, the second light beam L2 emitted from the light projector 31 of the second reflection type optical sensor is reflected by the lower surface of wafer W and received by the second light receiver 32.

As shown in FIGS. 6 and 7, the first and second light receivers 22 and 32 are arranged in positions to receive light reflected by the wafer W supported correctly. Consequently, when the wafer W is not supported in the correct position or posture, such as when the wafer W is inclined, the light beam L1 or L2 reflected by the wafer W fails to reach the first or second light receiver 22 or 32.

If the wafer W is correctly supported by the substrate supporting device 3, the light beam L1 or L2 reflected by the wafer W always reaches the first or second light receiver 22 or 32 even when the substrate supporting device 3 is rotated. Thus, the wafer W (or the substrate supporting device 3) need not be rotated in order to determine a supported condition of wafer W.

Figure 8:
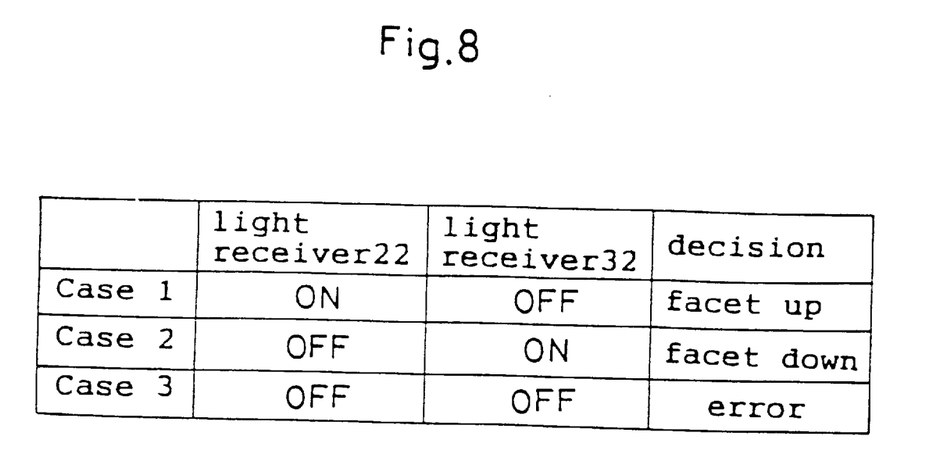
FIG. 8 is an explanatory view of determination criteria used in the third embodiment.

FIG. 8 shows a table of criteria for determining supported conditions of wafer W based on light reception by the two light receivers 22 and 32. In this table, "ON" represents a light reception, and "OFF" a non-reception.

In Case 1, the first light receiver 22 is ON and the second light receiver 32 is OFF. These results indicate that the facet of wafer W is facing up. In Case 2, the first light receiver 22 is OFF and the second light receiver 32 ON. These results indicate that the facet of wafer W is facing down. In both Cases 1 and 2, the wafer W is determined to be supported in the correct posture. In Case 3, the two light receivers 22 and 32 are both OFF. These results indicate that the wafer W is incorrectly supported.

Thus, the two reflection type optical sensors enable a determination of whether the wafer W is supported in a correct posture by the substrate supporting device 3 or not, and a determination as to which surface of the wafer W is the facet.

Only one reflection type optical sensor may be provided where the facet being only the upper surface or lower surface (e.g. facing up) is regarded as the correctly supported condition. Where the wafer W is determined to be in the correctly supported condition regardless of the position of the facet, the determination may be made by ORing the results of detection by the two light receivers 22 and 32.

Each of the reflection type optical sensors may include a light projector for emitting a light beam in a direction almost perpendicular to the surface of wafer W, and a light receiver for receiving the light reflected therefrom in a near perpendicular direction. Whether the wafer W is supported in a correct posture or not may be determined also with such a light beam incident on the wafer W from a direction approximately perpendicular thereto.

Fourth Embodiment

The fourth embodiment also corresponds to the substrate spin treating method and apparatus in the second aspect of the invention.

Figure 9A:
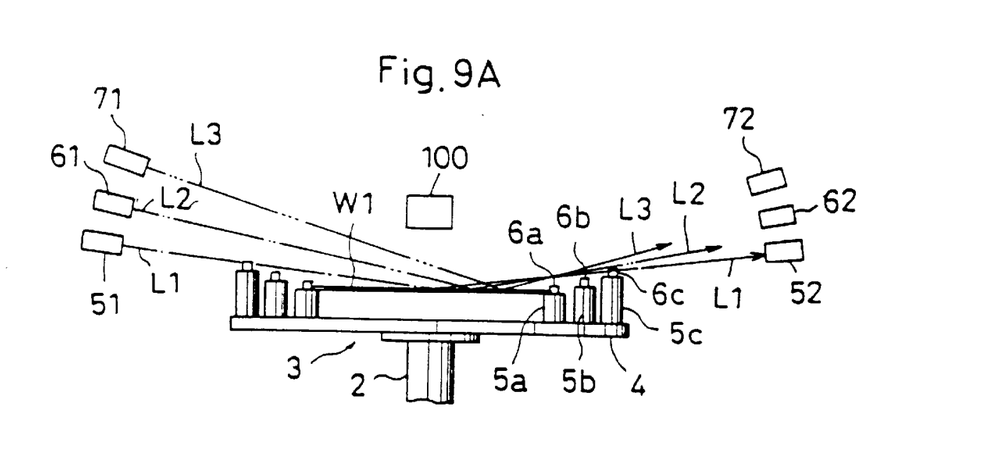
FIGS. 9A, 9B and 9C are schematic side views of a substrate spin treating apparatus in a fourth embodiment of the invention.
Figure 9B:
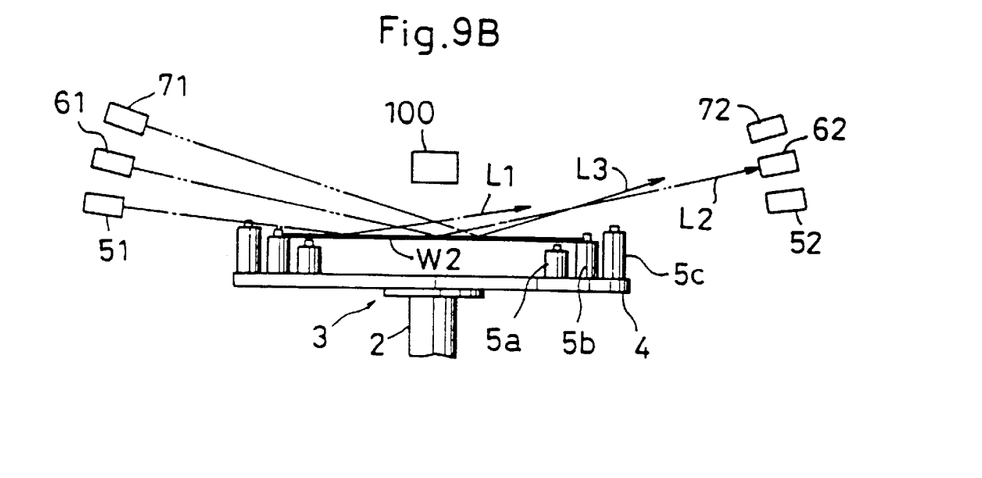
Figure 9C:
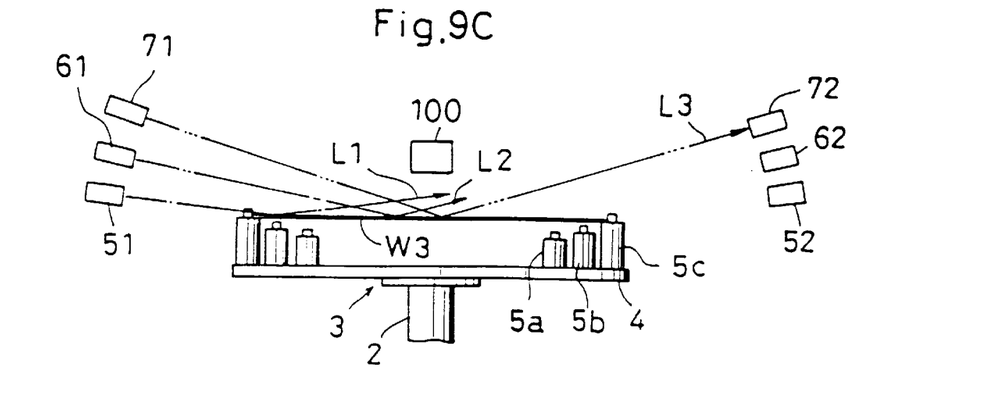

As shown in FIGS. 9A, 9B and 9C, the substrate supporting device 3 includes three types of support elements 5a, 5b and 5c and positioning elements 6a, 6b and 6c for supporting and positioning wafers W (W1, W2 and W3) of three different sizes.

Of the three types of support elements 5a, 5b and 5c, the radially intermediate support elements 5b have a substrate supporting plane (upper surfaces thereof) higher than that of the innermost support elements 5a. The outermost support elements 5c have a substrate supporting plane higher than that of the intermediate support elements 5b. Thus, as shown in FIGS. 9A, 9B and 9C, any one of the wafers W1–W3 of the three different sizes (e.g. 5-inch, 6-inch and 8-inch semiconductor wafers) may be supported at a different level on the substrate supporting device 3.

The substrate supporting device 3 is surrounded by a first reflection type optical sensor having a first light projector 51 and a first light receiver 52, a second reflection type optical sensor having a second light projector 61 and a second light receiver 62, and a third reflection type optical sensor having a third light projector 71 and a third light receiver 72, all located above the wafer W. The apparatus further includes three reflection type optical sensors arranged below the wafer W, but these sensors are omitted from the drawings for expediency of illustration. FIGS. 9A, 9B and 9C show the wafers W having the facets facing up, respectively.

As shown in FIGS. 9A, 9B and 9C, reflected light beams are detected by different light receivers when the smallest wafer (5-inch semiconductor wafer) W1 is supported, when the intermediate size wafer (6-inch semiconductor wafer) W2 is supported and when the largest wafer (8-inch semiconductor wafer) W3 is supported. That is, when the smallest wafer (5-inch semiconductor wafer) W1 is supported as shown in FIG. 9A, only light beam L1 emitted from the light projector 51 is received by the light receiver 52 of the first reflection type optical sensor. When the intermediate size wafer (6-inch semiconductor wafer) W2 is supported as shown in FIG. 9B, only light beam L2 emitted from the light projector 61 is received by the light receiver 62 of the second reflection type optical sensor. When the largest wafer (8-inch semiconductor wafer) W3 is supported as shown in FIG. 9C, only light beam L3 emitted from the light projector 71 is received by the light receiver 72 of the third reflection type optical sensor. Whichever one of the wafers W1–W3 is supported, the light receiver 52, 62 or 72 does not receive the light beam unless the wafer is in a correct posture. Thus, it is possible to determine from light received by the light receiver 52, 62 or 72 which one of the different size wafers W1–W3 is supported in a correct posture.

In the third and fourth embodiments also, whether the wafer W is supported in the correct posture or not is determined immediately based on the light received by the light receivers, without rotating the wafer W. Thus, the supported condition of wafer W may be determined within a short time.

In each of the foregoing embodiments, the plurality of light projectors acting as light sources may be replaced by a single light source (e.g. a laser) for emitting one light beam, and a beam splitter for splitting the light beam into a plurality of beams.

The present invention is applicable to treatment of not only semiconductor wafers, but glass substrates for liquid crystal displays, glass substrates for photomasks, and substrates for optical disks. Such substrates may have circular, square or other shapes.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate spin treating apparatus for effecting a predetermined treatment of a substrate by spinning the substrate about a vertical axis, said apparatus comprising:

substrate supporting means including support elements for supporting said substrate, and positioning elements for contacting outer peripheries of said substrate supported by said support elements to check for horizontal movement thereof, said support elements and said positioning elements being cooperative to support said substrate;

rotating means for rotating said substrate supporting means about said vertical axis;

a substrate sensor for determining whether said substrate is supported by said substrate supporting means;

light projecting means disposed around said substrate supporting means for projecting light traveling horizontally along a plurality of projection tracks overlapping said substrate supported by said substrate supporting means and extending at an angle to one another;

light receiving means disposed around said substrate supporting means for receiving the light projected by said light protecting means and having traveled horizontally along said projection tracks;

posture determining means for determining whether said substrate is correctly supported by said substrate supporting means, based on results of determination made by said substrate sensor and result of reception by said light receiving means of the light prolected by said light projecting means and having traveled horizontally along said projection tracks; and substrate treating means for effecting said predetermined treatment of said substrate supported by said substrate supporting means;

wherein said posture determining means is operable, while said substrate supporting means is maintained motionless, to determine whether said substrate is correctly supported by said substrate supporting means, and when said substrate is determined to be correctly supported by said substrate supporting means said substrate supporting means is rotated about said vertical axis for allowing said substrate treating means to effect said predetermined treatment of said substrate correctly supported by said substrate supporting means.

2. A substrate spin treating apparatus as defined in claim 1, wherein said light projecting means and said light receiving means are arranged above upper ends of said support elements, such that said light projecting means projects light traveling horizontally and slightly over an upper surface of said substrate supported in a correct posture by said substrate supporting means, said light being received by said light receiving means.

3. A substrate spin treating apparatus as defined in claim 1, wherein said light projecting means and said light receiving means include plural pairs of light projectors and light receivers, said light projectors and said light receivers in the respective pairs are arranged such that said projection tracks extend from said light projectors to said light receivers in the respective pairs to overlap said substrate supported by said substrate supporting means and to extend at an angle to one another.

4. A substrate spin treating apparatus as defined in claim 1, wherein said light projecting means and said light receiving means include a single pair of light projector and light receiver, and a reflector for reflecting the light projected by the light projector at least once before the light is received by the light receiver, and for causing the light traveling horizontally to travel horizontally again, said reflector reflecting the light such that a projection track of the light before being reflected by said reflector overlaps said substrate supported by said substrate supporting means and extend at an angle to one another.

5. A substrate spin treating apparatus as defined in claim 1, further comprising warning means for giving an alarm when said substrate is determined by said posture determining means to be incorrectly supported by said substrate supporting means, as a result of determination made by said posture determining means while said substrate supporting means is maintained still.

6. A substrate spin treating apparatus for effecting a predetermined treatment of a substrate by spinning the substrate about a vertical axis, said apparatus comprising:

substrate supporting means including supporting elements for supporting said substrate, and positioning elements for contacting outer peripheries of said substrate supported by said support elements to check a horizontal movement thereof, said support elements and said positioning elements being cooperative to support said substrate;

rotating means for rotating said substrate supporting means about said vertical axis;

light projecting means for projecting a light beam to be reflected by a surface of said substrate supported motionless on said substrate supporting means;

light receiving means disposed in a position for receiving said reflected light beam projected by said light proiecting means and reflected by said surface of said substrate when said substrate is supported correctly by said substrate support means;

posture determining means for determining whether said substrate, when motionless, is correctly supported by said substrate supporting means, based on whether said light beam projected by said light projecting means and reflected by said surface of said substrate is received by said light receiving means; and substrate treating means for effecting said predetermined treatment of said substrate supported by said substrate supporting means;

wherein said posture determining means is operable, while said substrate supporting means is maintained still, to determine whether said substrate is correctly supported by said substrate supporting means and when said substrate is determined to be correctly supported by said substrate supporting means, said substrate supporting means is rotated about said vertical axis for allowing said substrate treating means to effect said predetermined treatment of said substrate correctly supported by said substrate supporting means.

7. A substrate spin treating apparatus as defined in claim 6, further comprising warning means for giving an alarm when said substrate is determined by said posture determining means to be incorrectly supported by said substrate supporting means as a result of determination made by said posture determining means while said substrate supporting means is maintained still.

8. A substrate spin treating apparatus as defined in claim 6, wherein said light projecting means includes a first light projector for projecting a first light beam to be reflected by an upper surface of said substrate supported on said substrate supporting means, and a second light projector for projecting a second light beam to be reflected by a lower surface of said substrate supported on said substrate supporting means; and said light receiving means includes a first light receiver disposed in a position for receiving said first light beam projected by said first light projector and reflected by said upper surface of said substrate when said substrate is supported correctly by said substrate support means, and a second light receiver disposed in a position for receiving said second light beam projected by said second light projector and reflected by said lower surface of said substrate when said substrate is supported correctly by said substrate support means;

said posture determining means determining whether said substrate is correctly supported by said substrate supporting means, based on reception by said first light receiver of the first light beam projected by said first light projector and reflected by said upper surface of said substrate and reception by said second light receiver of the second light beam projected by said second light projector and reflected by said lower surface of said substrate.

9. A substrate spin treating apparatus as defined in claim 6, wherein said substrate supporting means is constructed for selectively supporting a plurality of N (N being an integer 2 or more) substrates of different sizes at varied heights;

said light projecting means includes a plurality of N light projectors corresponding in number to said different sizes of said substrates supportable by said substrate supporting means, each of said light projectors projecting a light beam to be reflected by a surface of a substrate supported at a height corresponding to a size of said substrate; and said light receiving means including a plurality of N light receivers arranged in a one-to-one relationship to said light projectors, each of said light receivers being disposed in a position for receiving a light beam projected by a corresponding one of said light projectors and reflected by a surface of a substrate supported correctly by said substrate supporting means and at a height corresponding to a size of said substrate;

said posture determining means determining whether a substrate of a selected size is correctly supported at one of said varied heights corresponding to said selected size by said substrate supporting means, based on light reception by each of said light receivers of the light beam emitted from a corresponding one of said light projectors toward said substrate of said selected size and reflected by surfaces of said substrate supported on said substrate supporting means.

10. A substrate spin treating apparatus for effecting a predetermined treatment of a substrate by spinning the substrate about a vertical axis, said apparatus comprising:

a substrate supporting device including support elements for supporting said substrate, and positioning elements for contacting outer peripheries of said substrate to check for horizontal movement thereof;

a motor for rotating said substrate supporting device about said vertical axis;

a substrate sensor for detecting said substrate supported by substrate supporting device;

light projecting device disposed around said substrate supporting device for projecting light having a plurality of horizontal projection tracks overlapping said substrate supported by said substrate supporting device and extending at an angle to one another;

light receiving device disposed around said substrate supporting device to pair with said light projecting device;

posture determining device for determining whether said substrate is correctly supported by said substrate supporting device, based on signals from said substrate sensor and said light receiving device; and substrate treating device for effecting said predetermined treatment of said substrate supported by said substrate supporting device.

11. A substrate spin treating apparatus as defined in claim 10, wherein said light projecting device and said light receiving device are arranged above upper ends of said support elements, said light projecting device projecting light traveling horizontally and slightly over an upper surface of said substrate supported in a correct posture by said substrate supporting device to be received by said light receiving device.

12. A substrate spin treating apparatus as defined in claim 10, wherein said light projecting device and said light receiving device include plural pairs of light projectors and light receivers.

13. A substrate spin treating apparatus as defined in claim 10, wherein said light projecting device and said light receiving device include a single pair of light projector and light receiver, and a reflector for reflecting the light from the light projector to the light receiver.

14. A substrate spin treating apparatus as defined in claim 10, further comprising warning device for giving an alarm when said substrate is determined by said posture determining device to be incorrectly supported by said substrate supporting device.

15. A substrate spin treating apparatus for effecting a predetermined treatment of a substrate by spinning the substrate about a vertical axis, said apparatus comprising:

substrate supporting device including support elements for supporting said substrate, and positioning elements for contacting outer peripheries of said substrate to check for horizontal movement thereof;

motor for rotating said substrate supporting device about said vertical axis;

light projecting device for projecting a light beam toward said substrate supported on said substrate supporting device, and causing said light beam to be reflected by a surface of said substrate;

light receiving device for receiving said reflected light beam;

posture determining device for determining whether said substrate is correctly supported by said substrate supporting device based on whether said reflected light beam is received by said light receiving device; and substrate treating device for effecting said predetermined treatment of said substrate supported by said substrate supporting device.

16. A substrate spin treating apparatus as defined in claim 15, further comprising warning device for giving an alarm when said substrate is determined by said posture determining device to be incorrectly supported by said substrate supporting device.

17. A substrate spin treating apparatus as defined in claim 15, wherein said light projecting device includes first and second light projectors for projecting first and second light beams toward upper and lower surfaces of said substrate supported on said substrate supporting device, and causing said first and second light beams to be reflected by said surfaces of said substrate, respectively, and said light receiving device includes first and second light receivers for receiving first and second reflected light beams, respectively, said posture determining device determining whether said substrate is correctly supported by said substrate supporting device based on light reception by said first and second light receivers.

18. A substrate spin treating apparatus as defined in claim 15, wherein said substrate supporting device is for selectively supporting a plurality of N (N being an integer 2 or more) substrates of different sizes at varied heights, said light projecting device including a plurality of N light projectors arranged in corresponding relations with said varied heights, said light receiving device including a plurality of N light receivers arranged in corresponding relations with said varied heights, said posture determining device determining whether a substrate of a selected size is correctly supported at one of said varied heights corresponding to said selected size by said substrate supporting device, based on light reception by said light receivers of the plurality of N light beams emitted from said light projectors toward said substrate of said selected size and reflected by surfaces of said substrate supported on said substrate supporting device.

* * * * *